United States Patent [19]

Favre et al.

[11] Patent Number: 5,545,998
[45] Date of Patent: Aug. 13, 1996

[54] MIXING DEVICE FOR THE MIXING OF FLUIDS IN AN NMR APPARATUS INCLUDING A SPRING ATTACHED TO THE COIL AFFIXED TO A MIXING ROD

[75] Inventors: Patrick Favre; Urban Frey, both of Lausanne; Daniel Marek, Möriken, all of Switzerland; François Metz, Irigny, France

[73] Assignee: Spectrospin AG, Fallanden, Switzerland

[21] Appl. No.: 308,995

[22] Filed: Sep. 20, 1994

[51] Int. Cl.$^6$ ...................................... G01V 3/18
[52] U.S. Cl. ...................................................... 324/321
[58] Field of Search .................................. 324/300, 307, 324/309, 303, 306, 308, 316, 317, 318, 321

[56] References Cited

U.S. PATENT DOCUMENTS

| | | | |
|---|---|---|---|
| 3,609,519 | 9/1971 | Seki et al. | 324/310 |
| 3,939,367 | 2/1976 | Ramirez | 310/20 |
| 4,698,595 | 10/1987 | Röschmann . | |
| 4,902,975 | 2/1990 | Kess . | |
| 5,184,078 | 2/1993 | Rapoport | 324/321 |
| 5,438,261 | 8/1995 | Codina et al. | 324/207.16 |

FOREIGN PATENT DOCUMENTS

| | | |
|---|---|---|
| 0136642 | 9/1984 | European Pat. Off. . |
| 0164801 | 6/1985 | European Pat. Off. . |

OTHER PUBLICATIONS

"A high pressure probe for NMR studies of homogeneous catalysts" by D. G. Vander Velde and J. Jonas in: Journal of Magnetic Resonance 71 (1987) pp. 480–484.

*A High–pressure NMR Probehead for Measurements at 400 MHz*, A. Zahl et al., Review of Scientific Instruments, vo. 65, Apr., 1994, pp. 882–886.

*Primary Examiner*—Sandra L. O'Shea
*Assistant Examiner*—Roger Phillips

[57] ABSTRACT

A mixing device for the mixing of fluid measuring samples in an NMR measuring device, whereby the measuring device includes a rod (10) which is arranged coaxially to the main field magnet coil of the NMR measuring device to be movable in the axial direction and, on one end, exhibits a piston projecting into the measuring sample and, with the assistance of a drive coil (8) arranged at the end facing away from the measuring sample, is moved in the axial direction when current flows through the drive coil (8), wherein a spring element (7) is provided to move the rod (10) into a rest position when no current flows through the drive coil (8), is characterized by the drive coil (8) being arranged, in an axially movable fashion, in the inhomogeneous region of the magnetic field produced by the main field magnet coil coaxial to the main field magnet coil, the drive coil (8), on one axial end, being rigidly connected to the rod (10) and, on the end facing away from the rod (10), being connected, via the spring element (7), to a housing (1) surrounding the NMR measuring apparatus. In this fashion the mixing device does not require magnetic components which would interfere with the homogeneity of the NMR magnetic field and can be arranged compactly in the vicinity of the measuring sample.

11 Claims, 6 Drawing Sheets

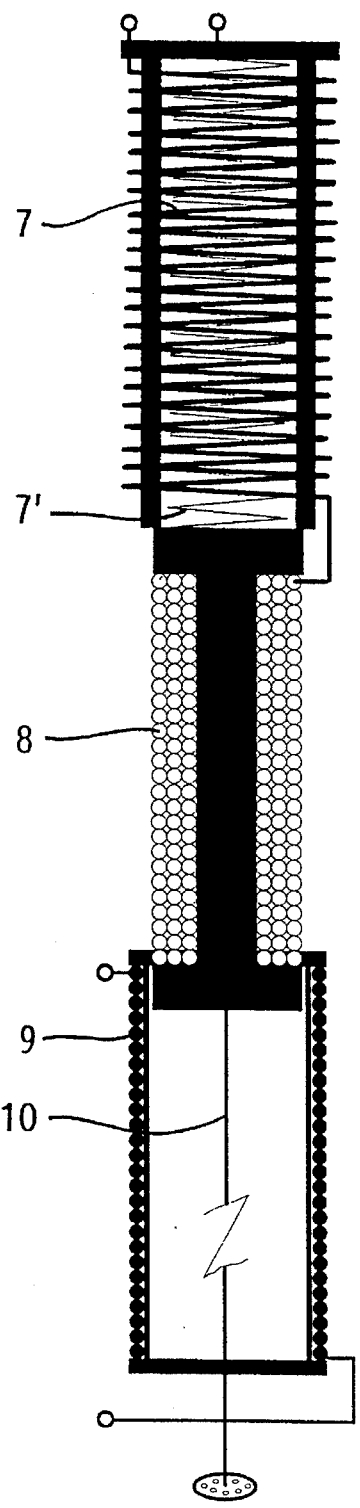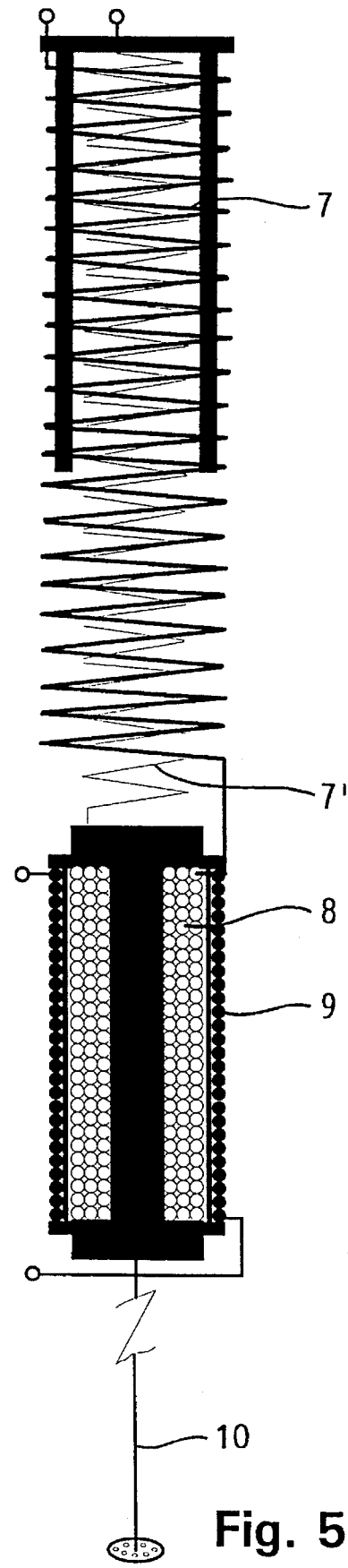
Fig. 5a
Fig. 5b

MIXING DEVICE FOR THE MIXING OF FLUIDS IN AN NMR APPARATUS INCLUDING A SPRING ATTACHED TO THE COIL AFFIXED TO A MIXING ROD

BACKGROUND OF THE INVENTION

The invention concerns a mixing device for the mixing of, in particular, fluids and/or gas-phase measuring samples in a nuclear magnetic resonance (NMR) measuring apparatus with a high field magnet coil for the production of a homogeneous static magnetic field and a measurement volume within the measurement sample, whereby the measuring apparatus includes a rod which is arranged coaxially to the main field magnet coil, is movable in an axial direction, exhibits, on one end, a piston projecting into the liquid and/or gas-phase measuring sample, and with the assistance of a drive coil arranged at the end facing away from the measuring sample, is moved in the axial direction by the flow of current through the drive coil with a spring element being provided for to move the rod into a rest position when no current flows through the drive coil.

A mixing apparatus of this kind is, for example, known from the article "A High-Pressure Probe for NMR Studies of Homogeneous Catalysis" by Velde and Jonas in "Journal of Magnetic Resonance", No. 71, pp. 480–484, 1987.

The high-pressure NMR measuring apparatus described therein serves for the investigation, with the assistance of nuclear magnetic resonance at high pressures, of chemical reactions which take place in a saturated gas-fluid mixture. From the theory of partial pressures it is known that, the higher the applied external pressure, the larger the fraction of gas which can be dissolved in the liquid. By means of the resulting chemical reactions, the saturated state of the mixture is destroyed and must be constantly adjusted.

The saturated state is an equilibrium state which depends on the temperature as well as the pressure. For this reason, for this type of measurement, it is necessary to have a variable constant-pressure apparatus in the range from 1 to 1000 bar with temperature regulation (typically in the region of −20° C. to +180° C.).

In order to quantitatively record the observed chemical reactions, it is necessary for the reactions to take place evenly and simultaneously within the entire liquid. It is therefore necessary for the gas and the fluid to mix with each other as quickly as possible and as evenly as possible and, in fact, before the reaction sets-in. An active mixing process is therefore essential for this type of investigation. Without an active mixing procedure, the mixing process would only take place by means of diffusion and would therefore transpire very slowly. It takes on the order of several days to achieve a saturated state through diffusion only. On the other hand, an active mixing procedure shortens the necessary mixing time by many orders of magnitude; the saturated state is achieved in only 10 to 60 seconds.

The mixing method should preferentially take place within the main field magnet of the NMR measuring apparatus in order to avoid additional losses in time. In this fashion the device is available for further measurement as quickly as possible and is therefore capable of exactly recording the time development of the chemical reaction. During the NMR measurement procedure, which takes place at constant pressure, it is necessary for the mixing procedure to be repeated from time to time. This is necessary since gas is used-up by the chemical reaction, and therefore new gas must be added and mixed-in in order to restore the required saturated state. Only a measuring procedure carried out in this fashion leads to reliable, reproduceable measurement values of the time development of the reaction.

This type of reaction time development measurement can be carried out at different temperatures and pressures which, in each case, are kept constant during the measurement procedure.

This mixing apparatus itself should, preferentially, be non-magnetic so that the necessary extremely high homogeneity of the magnetic field produced by the main field coil for the NMR measurement is not deteriorated due to the overlap of magnetic fields from the measuring apparatus. It is therefore essential that ferromagnetic or permanent magnetic materials be, by all means, avoided in the measuring apparatus or, when absolutely necessary, be arranged as far away as possible from the magnetic center of the NMR measuring apparatus.

In a known mixing method, the measuring sample to be shaken is initially removed from the main field magnet and subsequently is brought in again to the main field magnet in order to carry out the NMR measurement. A disadvantage of the known method is that the measuring sample begins to react following the shaking and before the NMR measurement has begun. In addition, the temperature of the measurement sample changes during this process and must, subsequently, be restored again to the desired constant value.

In another known measurement method, electric motors with permanent magnets are utilized in order to produce a mechanical shaking motion. A method of this type as, for example, described in the above cited article in JMR 71, 480–484 (1987) exhibits, however, a series of serious disadvantages:

The ferromagnetic and permanent magnetic materials contained in the electric motor distort the homogeneous field of the NMR main field magnet. In addition, the permanent magnet portion produces additional inhomogeneous fields.

Magnetic fields between the electric motor and the superconducting magnet system can lead to mechanical stability problems in the event that the two are too close to each other.

In order to keep the mutual influences between the electric motor and the NMR main field magnet as small as possible it is necessary that the electric motor be positioned very far away from the magnetic center of the NMR main field magnet. This necessarily leads to a large and cumbersome mixing apparatus.

In the event that the electric motor works outside of the main high pressure area in which the NMR measuring sample is located, mechanically movable high pressure feed-throughs are necessary in order to transmit the shaking motion. The latter are extremely difficult to produce, unreliable, and nearly impossible to realize at high pressure. On the other hand, an electric motor arranged together with the measuring sample in the high pressure region likewise leads to serious technical problems.

In contrast thereto it is the purpose of the present invention to present a mixing device of the above mentioned kind with which the homogeneous magnetic field of the NMR main field magnet is not encroached upon during the course of the NMR measurement having no mechanical forces present between the measuring device and the NMR main field magnet and which is capable of arrangement in spatial proximity to the NMR measuring magnet to work in a particularly reliable fashion in a high pressure region, wherein the entire apparatus is capable of particularly compact configuration.

SUMMARY OF THE INVENTION

This purpose is achieved in accordance with the invention in a fashion which is as surprisingly simple as it is effective in that the drive coil is arranged in the inhomogeneous region of the magnetic field produced by the main field magnet coil coaxially secured, in a movable fashion, to the main field magnet coil with the assistance of the spring element and is rigidly connected to the rod.

Through the configuration of the drive coil in the inhomogeneous portion of the NMR magnetic field in the mixing device in accordance with the invention, the mechanical forces for driving the movable rod are produced with the assistance of the NMR magnetic field, functioning as a stator, by the flow of current through the drive coil without the necessity, as in conventional electric motors, for magnetic parts. The axial Lorentz force acting on the current carrying drive coil in the inhomogeneous magnetic field is approximately equal to the product of the coil current, field gradient and field strength. "Field" refers to the axial field component of the magnet. After switching off the current through the drive coil the mixing device does not influence, in any fashion, the homogeneous magnetic field in the measurement volume of the NMR apparatus. In this manner the mixing device in accordance with the invention can also be arranged in close proximity to the measurement volume to facilitate a particularly compact construction of the entire installation.

The utilization of the magnetic field produced by the main field magnet of the NMR configuration as a stator field of an iron-free DC current rotational motor by appropriate configuration of a rotating coil in the magnetic field is per se known in the art through EP 0 136 642 B1. The configuration described therein serves, however, only for the production of a linear mixing motion in a high pressure spectrometer and is categorically different with regard to the mixing device having the above mentioned features.

In a preferred embodiment of the, mixing device in accordance with the invention, the housing of the NMR measuring apparatus forms a high pressure chamber and the mixing device as well as the measuring sample are arranged in the high pressure region of the high pressure chamber. In this fashion the decisive advantage of the mixing device in accordance with the invention, namely that it can be arranged in proximity to the measuring sample without encroaching upon the magnetic field of the main field magnet can be utilized particularly effectively for the construction of an extremely compact and, with regard to its axial length in comparison to conventional configurations, strongly shortened NMR high pressure spectrometer.

An embodiment of the mixing device in accordance with the invention is particularly advantageous in which the spring element forms one of the necessary two electrical connections for the current supply of the drive coil which, in this embodiment, then serves two completely different functions simultaneously.

In particular, in a further embodiment, the spring element can be configured as a restoring spring, whereby the drive coil pulls the restoring spring against the spring force away from the housing to tension same. As soon as current no longer flows through the drive coil the restoring spring pulls the drive coil and rod in an axial direction away from the measuring sample.

An embodiment of the mixing device in accordance with the invention is particularly preferred in which a measuring coil is provided coaxial to the drive coil for the detection of the instantaneous axial position of the drive coil. The drive coil then induces, along its moving path, a current or voltage signal in the measuring coil which depends on its axial position. In this fashion, the mixing motion can be precisely monitored from outside. The dimensioning is such that the drive coil can be inserted into the measuring coil so that the configuration can be particularly compact.

Also within the purview of the invention is a method for the operation of the mixing device in accordance with the invention with which, as described above, the drive coil for the production of an axial up-and-down motion of the rod is supplied with low-frequency alternating current in the range of approximately 0.5 Hz to 10 Hz, preferentially, with sinusoidal amplitude. The utilization of a sinusoidal amplitude current supply leads to a sine-like deflection function of the drive coil with the rod in the axial direction during supply of the drive coil with alternating current. Experience has shown that the mixing motion is most effective in the above mentioned frequency range of 0.5 Hz to 10 Hz. In contrast, for example, to a triangular or tooth-shaped characteristic motion, a sine function allows for a particularly gentle catching of the mixing motion at the extrema.

A variation of this method is particularly preferred in which no current is sent through the drive coil during an NMR measurement of the measuring sample. In this fashion, a negative influence on the homogeneity of the NMR magnetic field is, in any event, avoided.

In a further variation on this method a DC current for the the adjustment of the rest position of the drive coil is superimposed on the low frequency AC current.

In an advantageous variation of the method, the instantaneous position of the drive coil is detected when current flows through same. In this manner it is possible to externally monitor and observe the mixing motion.

In a particularly preferred improvement of this variation of the method for operation of a mixing device in accordance with the invention having a measurement coil for the detection of the instantaneous axial position of the drive coil as described above, a high frequency alternating current, preferentially of the magnitude of approximately 10 kHz, is overlapped with the low frequency alternating current through the drive coil with, relative to the low frequency alternating current, a low amplitude. By means of the geometric configuration of the drive coil and the measuring coil both coils, when they are in close proximity to another, are strongly magnetically coupled. The high frequency alternating current through drive coil which overlaps the low frequency drive current has, due to its relatively high frequency in comparison to the inertia of the mixing apparatus, practically no influence on the drive process itself. It, however, induces a voltage in the measuring coil which depends on the axial separation between the measuring and the drive coil. The amplitude of the induced high frequency alternating current signal is a measure of the axial position of the drive coil and serves for the precise monitoring of the mixing motion.

Further advantages of the invention can be derived from the description and the drawing. Likewise, the above mentioned features and those which are to be described further below can be utilized in accordance with the invention individually or collectively in arbitrary combination. The embodiments shown and described are not to be considered as an exhaustive enumeration, but have exemplary character only in order to illustrate the invention.

BRIEF DESCRIPTION OF THE DRAWING

FIG. 5a shows the relative positionings of the drive coil and the measuring coil for the detection of the axial position of the drive coil in the rest position of the drive coil;

FIG. 5b shows the relative positionings of the drive coil and the measuring coil for the detection of the axial position of the drive coil in the extended state of the drive coil.

DESCRIPTION OF THE PREFERRED EMBODIMENT

Figure 1:
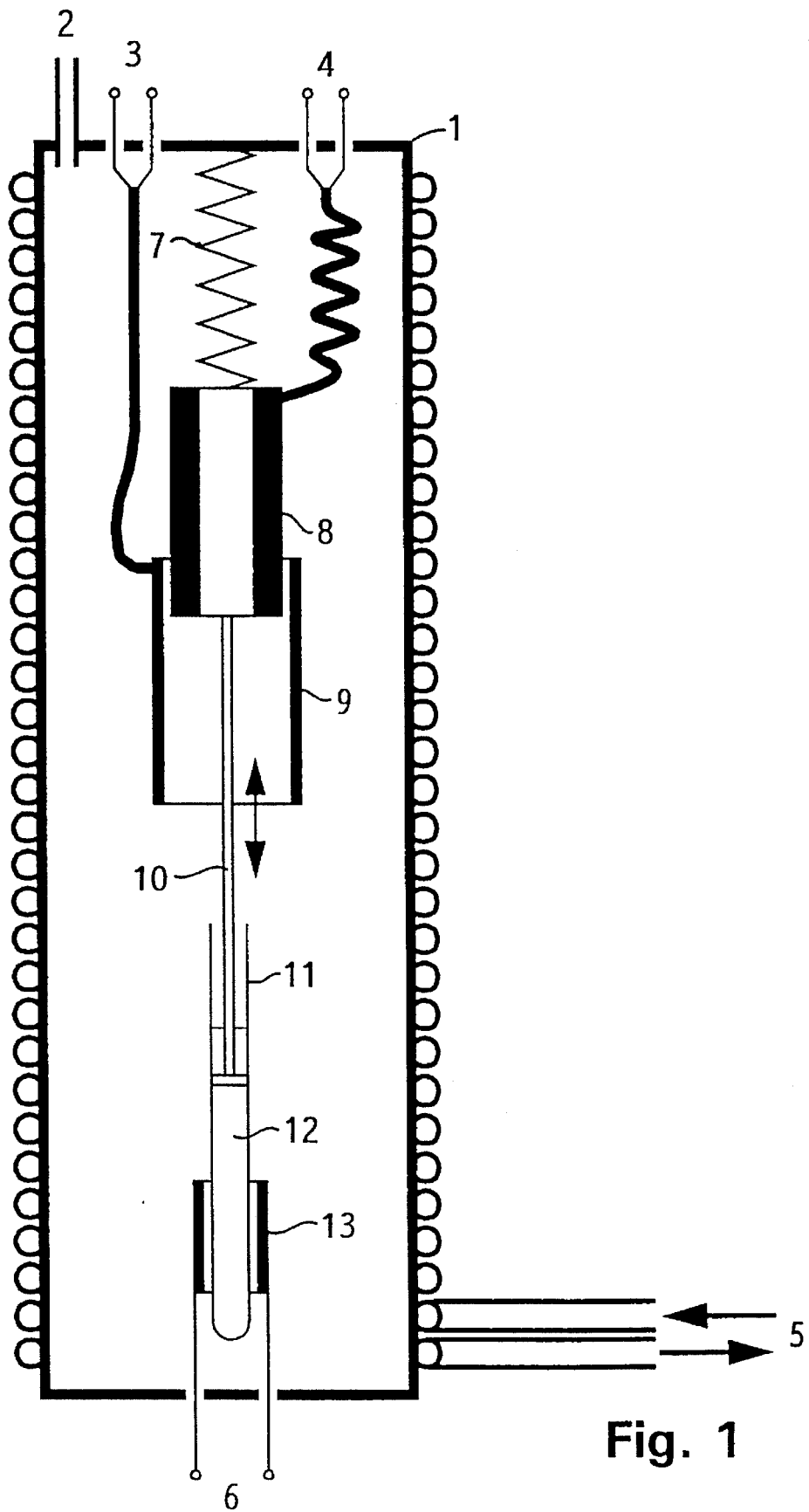
FIG. 1 shows a schematic longitudinal cut through an NMR high pressure measuring device with an inventive mixing device.
Figure 2:
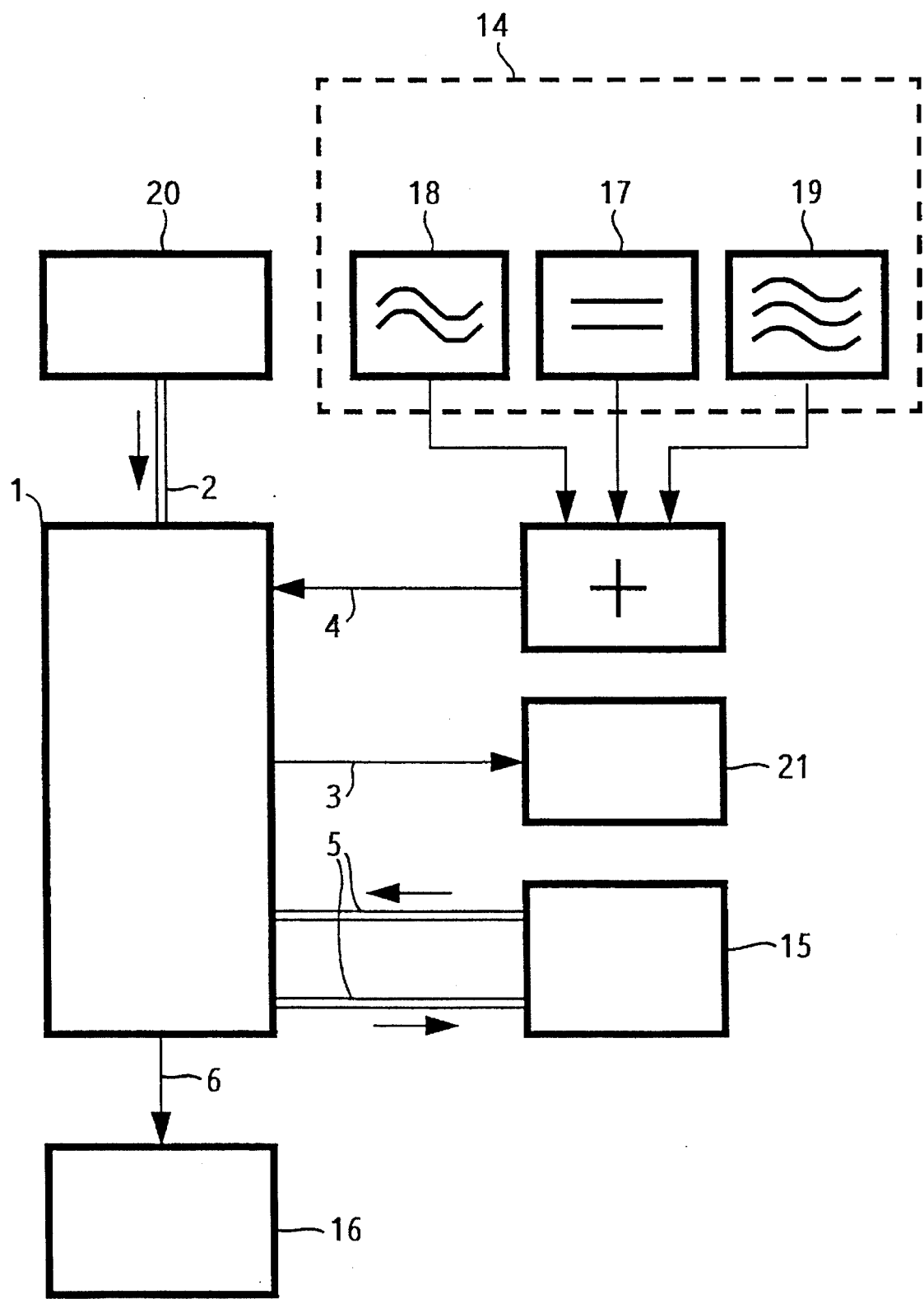
FIG. 2 shows a functional block diagram of the NMR measuring apparatus according to FIG. 1.

The schematic section of FIGS. 1 and 2 shows an NMR high pressure measuring apparatus with a housing 1 configured as a high pressure chamber and an access 2, required for purposes of pressure regulation, to which a gas compressor 20 is attached. A glass sample receptacle 11 is arranged in the lower region of the high pressure chamber and has a sample liquid 12 located at the homogeneity center of a main field magnet coil (not shown in the drawing) surrounding which an NMR coil 13 with connections 6 is arranged for extraction of a nuclear magnetic resonance signals from the sample. An axially moving rod 10 projects into the glass sample receptacle 11 with a piston arranged on its lower end within the glass sample receptacle 11. The piston mixes the sample fluid 12 as well as gases dissolved or mixed therein. It is moved with the assistance of a drive coil 8 which is arranged in the inhomogeneous part of the NMR magnetic field, functioning as a stator, and is connected to the rod 10 on the end located away from the sample. The drive coil 8 is connected to the housing 1 by means of a restoring spring 7 and is movable together with the rod in the axial direction. The connections 4 serve to supply current to the drive coil 8.

A measuring coil 9 is furthermore provided for whose inner diameter is larger than the outer diameter of the drive coil 8 so that the drive coil 8 can be inserted axially into the measuring coil 9. The current or voltage induced in the measuring coil 9 through the motion of the drive coil 8 is fed outwards through connections 3 so that the up-and-down motion of the mixing device can be observed and monitored externally.

A coiled pipe 5, through which a cooling or warming liquid can flow, is provided surrounding the housing 1 of the NMR high pressure measuring apparatus for the even temperature control of the measuring region.

The block diagram shown in FIG. 2 gives the function of the NMR measuring apparatus of FIG. 1:

The pressure within the housing 1 of the NMR measuring cell is held constant via an access conduit 2 with the assistance of a gas compressor 20. A temperature control unit 15 cools or warms the NMR measuring cell via a fluid flowing through the coiled pipe 5 and thereby keeps the measuring sample at a constant temperature.

The measuring signals extracted by the NMR coil 13 during the measuring phase are introduced via connections 6 to an NMR detector and, thereafter, further processed by a computer which is not shown. The fluid sample 12 is mixed, between measuring cycles, in the glass sample receptacle 11 with the assistance of the above described mixing apparatus. Towards this end a current generator 14 supplies current via connections 4 to the drive coil 8 located in the inhomogeneous portion of the NMR magnetic field. Hereby, as described more closely below, DC current is initially supplied to the drive coil 8 via a DC current generator 17 in order to adjust its rest position. With the assistance of a low frequency oscillator 18 which is capable of producing alternating current of frequency in the range of approximately 0.5 Hz to 10 Hz, the drive coil 8 is excited into its linear up-and-down motion for the purpose of mixing the sample fluid 12. Finally, the drive coil 8 is supplied, by means of high frequency oscillator 19, with a high frequency signal in the 10-kHz-range of lower amplitude which is detected by the measuring coil 9 shown in FIG. 1 and can be introduced to a position detector 21 via connections 3 in order to observe the instantaneous position of the drive coil 8 and thereby the time variation of the mixing motion.

Figure 3A:
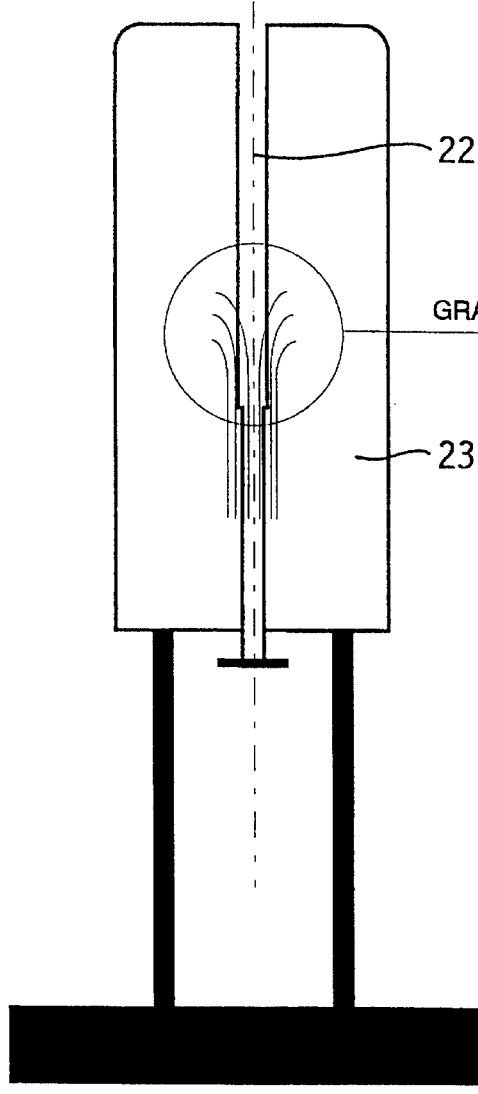
FIG. 3a shows a schematic longitudinal cut through an NMR high pressure measuring apparatus with cryostat.

The mixing device in accordance with the invention, as mentioned above, is provided for utilization in NMR experiments with which the fluid mixture to be analysed must be thoroughly mixed. It has been developed as an optional auxiliary means for introduction into a 400 MHz superconducting magnet, schematically indicated in FIG. 3a, with small room temperature bore 22 within a cryostat 23.

The fundamental principle of operation is the utilization of the magnetic field gradients which are located about the magnetic center due to the directional changes of the magnetic field lines.

Figure 3B:
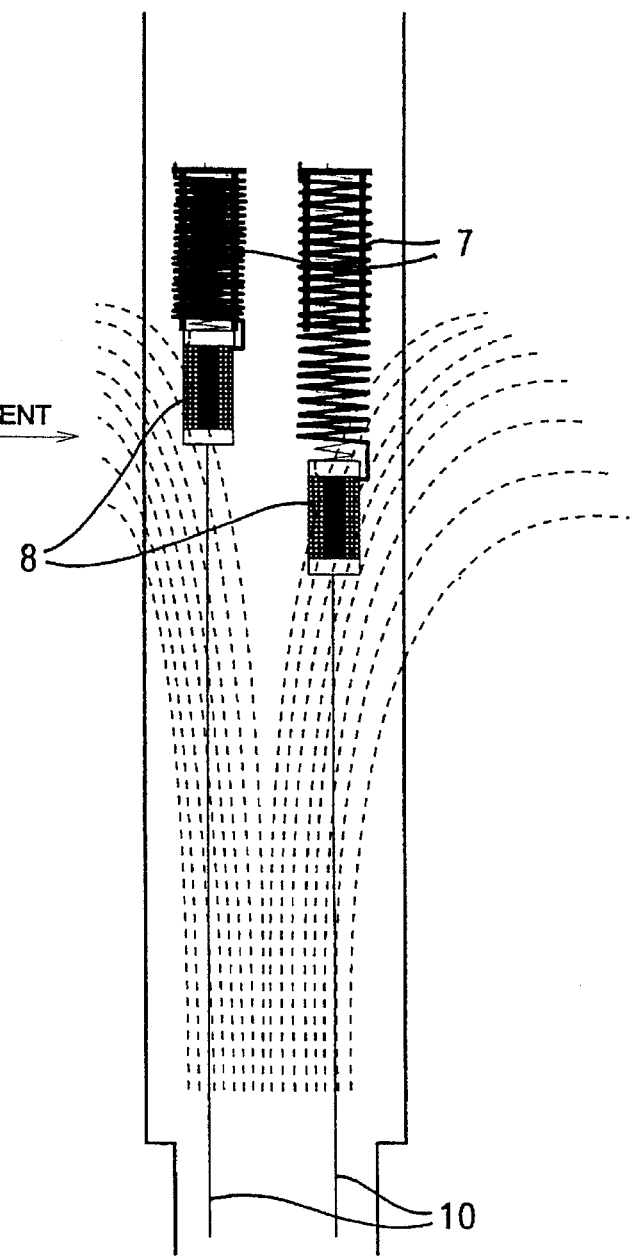
FIG. 3b shows an enlarged section of FIG. 3a with schematically indicated rest and extended positions of the mixing device in accordance with the invention within an inhomogeneous magnetic field.

The utilization of magnetic field gradients is possible for any arbitrary magnet with the same fundamental construction when the field gradients are precisely arranged and when small adjustments are carried out. FIG. 3b shows an enlarged section of FIG. 3a with the drive coil 8 in a rest position (left) and a deflected position (right) within the inhomogeneous magnetic field indicated by the curved field lines.

The mixer itself can comprise a small PTFE-sieve which is connected to a thin PTFE and Berylco rod. This configuration oscillates vertically with an amplitude of 25 mm within the glass tube containing the solution which is to be analysed by nuclear magnetic resonance.

Figure 4A:
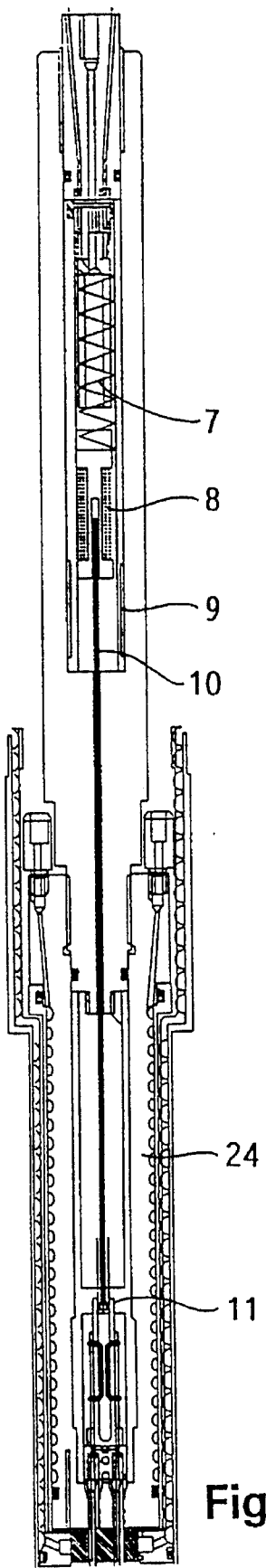
FIG. 4a shows a longitudinal cut through an NMR probe head having an axially mounted mixing device in accordance with the invention.

FIG. 4a shows an NMR probe head 24 with axially mounted mixing device. The upper part of the rod 10 extends through a 103 mm long extension pipe which is arranged directly above the NMR probe head 24 and which terminates in the intermediate motor region.

Figure 4B:
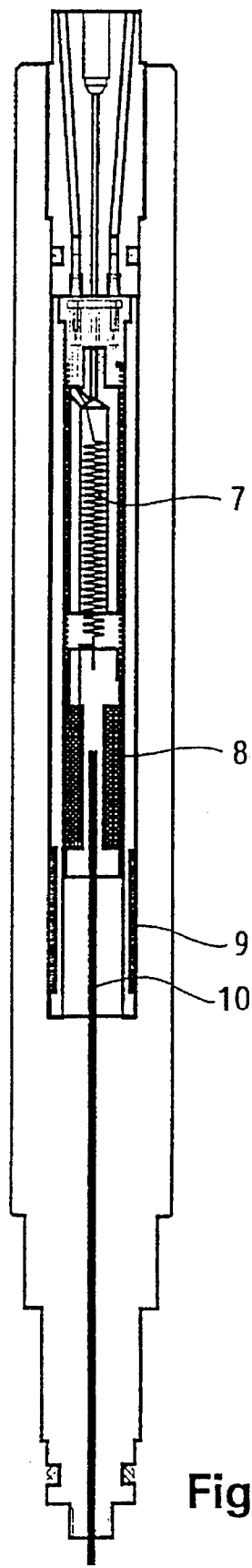
FIG. 4b shows a longitudinal cut through an embodiment of the mixing device in accordance with the invention.

The two principle components, e.g. the extension pipe and the intermediate motor region are Berylco cylinders. The inner of these two parts is connected to the inside of the NMR probe head 24 so that the entire system can be put under pressure. The mixing device can be removed and replaced by an upper stopper on the NMR probe head 24. Another possible embodiment of the mixing device in accordance with the invention is shown in FIG. 4b.

The motor is connected by means of a cable to an electronic low frequency sine-wave generator. This oscillator 18 was specially constructed for the present application and is provided with a dynamic indicator which continuously shows the motion of the mixer.

The mixer, during long experiments, can be started and stopped by remote control of a computer.

The motor comprises the drive coil 8, hung by means of two springs which also establish the electrical connections as suggested in FIG. 5a and FIG. 5b. The central spring 7' comprises insulated copper with a diameter of 0.2 mm and has a reduced strength to serve only as an electrical conductor. Its outer diameter assumes a value of 4.5 mm and its length in the rest position of FIG. 5a assumes a value of 44 mm. The outer restoring spring 7 comprises (non-insulated) Berylco with a diameter of 0.5 mm. It not only establishes an electrical connection but also supports the movable motor rod-sieve configuration and has the following dimensions: outer diameter 10 mm, 65 windings, length in the rest position 35 mm. Motion is achieved by means of a variable sine voltage of low frequency.

The drive coil 8 is wound from copper wire with a diameter of 0.2 mm and, in the embodiment shown, has the following dimensions: inner diameter 6 mm, outer diameter 10 mm, length 25 mm.

The force on the drive coil is largest at the location where the product of the axial field component times the axial field gradient of the magnet is maximum. By way of example, with a particular 400 MHz magnet having 52 mm room temperature bore, this location is approximately 220 mm from the magnetic center, in the axial direction. The position dependence of the forces at this location is relatively flat over a certain length, for example, within 5% over a length of 30 mm.

Figure 6:
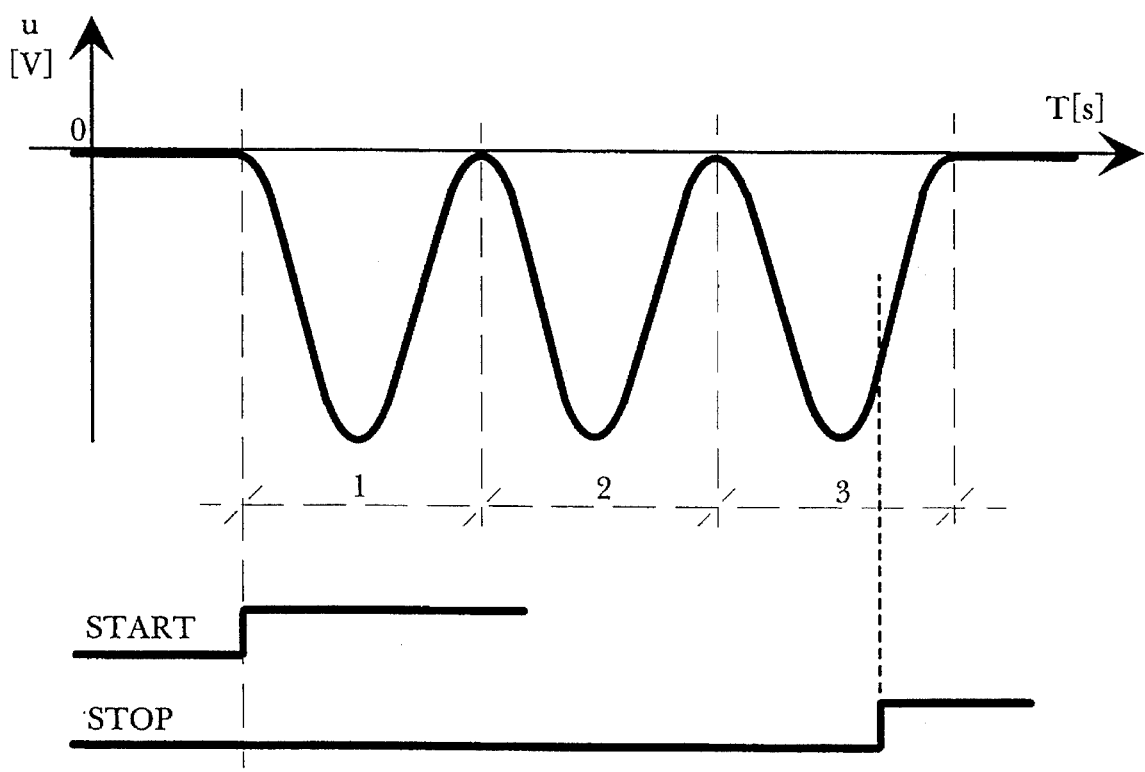
FIG. 6 shows a time diagram of the current through the drive coil.

In order to maximally utilize the force on the drive coil the center of the drive coil must, during the mixing procedure, move within the flat portion of the force curve. In addition, after switching off the piston mixing process, the rod 10 should come to rest on the upper edge of sample fluid 12. Both these conditions are achieved by positioning the center of the drive coil 8, in its rest position, approximately 1 cm above the position of maximum force in that, with the assistance of a DC current in the drive coil, its center is displaced to the position of maximum force and finally in that, with the assistance of a sine-shaped alternating current in the drive coil, the mixing motion is produced over a length of approximately ±1.3 cm. The overlapping of the DC and AC current portions can be accomplished with a single signal as shown in FIG. 6.

The force curves have been measured using a prototype with a spring 7 and a drive coil 8 which is attached to a long rod 10 projecting from the bottom of the magnet with a diameter of about 0.8 mm. This thin rod extends through a glass guiding tube having an inner diameter of 6 mm.

A DC voltage of 2 V is applied to the coil and the induced motion of the rod is measured at different heights by means of this voltage.

A second stationary pipe measuring coil 9, arranged directly below the drive coil 8, is utilized for measuring the motion.

A signal with high frequency (10 kHz) and small amplitude (100 mV) is additively overlapped with the sine signal on the movable drive coil 8. This high frequency signal induces a sine signal of 10 KHz in the stationary measuring coil 9 whose amplitude is approximately proportional to the spatial overlap of the two coils. This type of detection has the advantage that it gives a practically continuous linear measurement of the displacement. The stationary drive coil 8 comprises two winding layers with the following dimensions: diameter 12 mm, wire diameter 0.2 mm, length of the coil 25 mm.

This configuration is very simple and comprises only two coils and four electrical connections. There are no ferromagnetic components. The mixing device is appropriate for temperatures up to a maximum of 180° C.

The mixing device is connected to the electronics via a shielded cable having 4 conductors. For technical reasons the power ground and the ground of the signal detected by the measuring coil 9 are connected to the housing of the electronics unit. This ground is, however, not connected to the magnet housing 1. Therefore, the signals in the two coils are not grounded. They have no common ground due to the large differences in current through the two coils. For this reason 4 rather than 3 electrical connecting components are necessary.

The electronics was developed in order to serve two purposes:

a) To provide for a low frequency sine signal generator with the following flexibility:
   —frequencies of 0.5 Hz to 10 Hz
   —amplitudes up to 2 V peak to peak
   —positioning of the drive coil via a continuous offset voltage The last adjustment is very important; in this fashion it possible to compensate for the friction at the end points of the motion and therefore to optimize the working of the mixer.

b) Since the entire system (under pressure) is completely closed and non-visible from the outside it is necessary to know whether or not the mixer is working and what the amplitude of its motion is. If the viscosity of the product being investigated changes, the amplitude must be adjusted while its function is being verified. A motion detector system was developed in order to satisfy these requirements.

It is advantageous to start and stop the motion at the peak of a sine curve as shown in FIG. 6 in order to prevent a shaking of the liquid sample 12 out of the glass sample receptacle 11 or to prevent the building up of blockage above the mixture.

The low frequency oscillator 18 is suitable for digital processing. A cosine curve stored in an EPROM memory chip was utilized. A digital-to-analog converter followed the memory chip. When the operator pushed START the memory was continuously read and therefore delivered a sine-shaped signal at the start and stop. This operating mode has the advantage that a perfectly synchronized signal is achieved by starting and stopping.

Reference Symbol List

| | |
|---|---|
| 1 | housing |
| 2 | access to high pressure chamber |
| 3 | measuring coil connections |
| 4 | drive coil connections |
| 5 | coiled temperature control pipe |
| 6 | NMR coil connections |
| 7 | restoring spring |
| 7' | contact spring |
| 8 | drive coil |
| 9 | measuring coil |
| 10 | rod with piston |
| 11 | glass sample receptacle |
| 12 | sample liquid |
| 13 | NMR coil |
| 14 | current generator |

-continued

Reference Symbol List

| | |
|---|---|
| 15 | temperature control unit |
| 16 | NMR detector |
| 17 | DC current generator |
| 18 | low frequency oscillator |
| 19 | high frequency oscillator |
| 20 | gas compressor |
| 21 | position detector |
| 22 | room temperature bore |
| 23 | cryostat |
| 24 | NMR probe head |

We claim:

1. Mixing device for the mixing of a fluid and gas-phase measuring sample in a nuclear magnetic resonance (NMR) apparatus comprising:

a rod arranged coaxially to a main coil and movable along a central axis of the main coil;

a piston integral with a first end of the rod and adapted for immersion in the sample;

a spring attached to a housing of the main coil;

a movable drive coil arranged in an inhomogeneous field region of the main coil and integral with a second end of the rod such that the drive coil is movable therewith, the drive coil being attached to the spring for motion coaxial with the main coil, whereby when the drive coil is energized motion is imparted to the drive coil, rod, and piston concurrently thereby mixing the sample.

2. The mixing device of claim 1, wherein the housing forms a high pressure chamber and the mixing device and the measuring sample are arranged in a high pressure region of the high pressure chamber.

3. The mixing device of claim 1, wherein the spring is adapted for conducting current to the drive coil.

4. The mixing device of claim 1, wherein the spring comprises a restoring spring, whereby the drive coil pulls the restoring spring away from the housing when current passes through it to tension the restoring spring.

5. The mixing device of claim 1, further comprising a measuring coil arranged coaxial to the drive coil for detecting an instantaneous position of the drive coil.

6. A method for operating a mixing device for the mixing of a fluid and gas-phase measuring sample in a nuclear magnetic resonance (NMR) apparatus, the mixing device comprising a rod arranged coaxially to a main coil and movable along a central axis of the main coil, a piston integral with a first end of the rod and adapted for immersion in the sample, a spring attached to a housing of the main coil, a movable drive coil arranged in an inhomogeneous field region of the main coil and integral with a second end of the rod such that the drive coil is movable therewith, the drive coil being attached to the spring for motion coaxial with the main coil, whereby when the drive coil is energized motion is imparted to the drive coil, rod, and piston concurrently thereby mixing the sample, the method comprising the step of:

supplying the drive coil with a low frequency alternating current of 0.5 Hz to 10 Hz to produce an axial up-and-down motion of the rod.

7. The method of claim 6, comprising supplying the alternating current with a sinusoidal amplitude.

8. The method of claim 6, comprising stopping current flow through the drive coil during an NMR measurement of the measuring sample.

9. The method of claim 6, comprising supplying a direct current to adjust a rest position of the drive coil with the low frequency alternating current through the drive coil.

10. The method of claim 6, comprising detecting an instantaneous position of the drive coil when the current flows through same.

11. The method of claim 10, comprising supplying a high frequency alternating current having an amplitude which is small in comparison to a low frequency alternating current amplitude with the low frequency alternating current through the drive coil.

* * * * *